(12) United States Patent
Liu et al.

(10) Patent No.: US 6,628,488 B2
(45) Date of Patent: Sep. 30, 2003

(54) ELECTROSTATIC DISCHARGE PROTECTION CIRCUIT

(75) Inventors: Meng-Huang Liu, Hsinchu (TW); Chun-Hsiang Lai, Taichung (TW); Shin Su, Taipei (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 135 days.

(21) Appl. No.: 09/874,339

(22) Filed: Jun. 6, 2001

(65) Prior Publication Data

US 2002/0186517 A1 Dec. 12, 2002

(51) Int. Cl.⁷ .............................. H02H 9/00; H02H 3/20
(52) U.S. Cl. .................................. 361/56; 361/91.1
(58) Field of Search .................. 361/56, 91.7, 91.1; 307/86

(56) References Cited

U.S. PATENT DOCUMENTS 5,610,791 A  *  3/1997  Voldman ..................... 361/56
5,946,177 A  *  8/1999  Miller et al. ................. 361/56
6,118,323 A  *  9/2000  Chaine et al. ............... 327/333
6,118,640 A  *  9/2000  Kwong ........................ 361/56

* cited by examiner

Primary Examiner—Gregory J. Toatley, Jr.
Assistant Examiner—Zeev Kitov
(74) Attorney, Agent, or Firm—Dickinson Wright PLLC

(57) ABSTRACT

An electrostatic discharge (ESD) protection circuit is disclosed. This invention relates an electrostatic discharge protection circuit for multi-power and mixed-voltage integrated circuit. In the electrostatic discharge protection circuit of the invention, an ESD protection cell formed with voltage selector, control circuit and transistor is used to connect with a independent power and ESD bus is used to connect with each ESD protection cell so that each power is isolated from each other during normal operation. Therefore, each power can be operated independently and circuit will be prevented from ESD during ESD discharging.

6 Claims, 3 Drawing Sheets

ELECTROSTATIC DISCHARGE PROTECTION CIRCUIT

FIELD OF THE INVENTION

The present invention relates to an electrostatic discharge (ESD) protection circuit. More particularly, it relates an electrostatic discharge protection circuit for multi-power and mixed-voltage integrated circuit.

BACKGROUND OF THE INVENTION

In recent year, semiconductor components are widely used in the area of industry, commerce, residence, communication, traffic and electric power. In future, the trend of the electric components and electronics industry will be towards integrated circuit and high voltage, high current power, less switch module. However, there is a problem of electrostatic discharge in the integrated circuit yet. The damage caused by static electronics to the integrated circuit is a very serious issue. Especially, as the technology is getting progress, the techniques that are used to improve the operation speed of circuits such as short channel length, thinner gate oxides, utilization of polyside and silicide, as well as the techniques to reduce the Hot-carrier effects dramatically degrade the barring ability of ESD circuits.

Separate power is used widely in integrated circuit in order to avoid the noise coupling between the buses. However, the protection of ESD will be weak because of using separate power. Please refer to FIG. 1, which shows a circuit diagram of the conventional ESD protection of separate power. In FIG. 1, the circuit is consisted of two pairs of separate power. One pair is the first output power 60 and the first input power 70. Another pair is the second output power 80 and the second input power 90. If the ESD pulse is applied to the pin 10 with respect to the first input power 70, the ESD current may discharge through the ESD protection device 50 along the first path 20, which is the desired one for ESD current to go. However, there is a resistance 100 on the way of the first path 20 which is between the second input power 90 and the second output power 80. For integrated circuit, according to the formula of electric circuit: resistance multiplied by current is voltage. Thus, the resistance 100 may be large enough to introduce a large voltage drop. Therefore, there is a large voltage difference between the pin 10 and the first input power 70. If the voltage difference is too large, some internal circuit will be overstressed and then damaged because the ESD current is discharged along the unexpected second path 30.

Please refer to FIG. 2, which shows a circuit diagram of another conventional ESD protection of separate power. If there is a first ESD protection cell 110 connected to the first output power 60 and the first input power 70, the ESD current may be discharged through the third path 130. Similarly, if there is the second ESD protection cell 120 connected to the second output power 80 and the second input power 90, the ESD current may be discharged through the forth path 140. By using this design, the internal circuit can be protected from the overstress so the ESD protection cell is very important in separate power.

In the conventional technique, back-to-back diode or diode-connected device is always used to serve as this kind of ESD protection cell. As shown in FIG. 3, there is an internal circuit diagram of a conventional ESD protection cell. In the FIG. 3, a group of diodes 205 in back-to-back mode is used to connect the first power 201 and the second power 203. As shown in FIG. 4, there is an internal circuit diagram of another conventional ESD protection cell. In the FIG. 4, a group of Metal Oxide Semiconductor (MOS) 216 is used to connect the first power 212 and the second power 214.

In the design of ESD protection cell, the number of back-to-back diode or diode-connected device is depended on the requirement of noise immunity and the voltage difference between the first power and the second power. To enhance the noise immunity, more diode is needful. If the voltage difference is too large, more diode is needful to protect the circuit. However, the protection efficiency of the ESD protection cell will be degraded by the increased diode number between different powers. Moreover, because of the dependent character of power, the voltage drop at the ESD protection cell will be larger if more back-to-back diode or diode-connected device is used in the ESD protection cell. Thus, this is another problem in design.

Nowadays, many different power supplies may be needful in many integrated circuits for different internal circuitry and for capability of independent operation. Based on the requirement of changing operational dynamically, each internal circuit is controlled by independent power. For example, referring to FIG. 2, during power saving mode, if the first input power 70 is deactivated independently, the power from the first output power 60 energized will flow to the de-energized first input power 70 through the conventional ESD protection cells such as those in FIG. 3 or FIG. 4 so the first input power 70 are also energized undesirably. According to the example above, current may flow from an energized power to a de-energized power so that power saving mode is defeated therefore spending power. Furthermore, the internal circuit may be damaged by a short circuit.

SUMMARY OF THE INVENTION

In view of the background of the invention described above, if the conventional ESD protection device is used in the multi-power and mixed-voltage circuit, the interference will happen between each power so that the independent operation of each power will be defeated. Then, spending power is induced because the power of circuit is out of control undesirably. Supposing for enhancing the noise immunity between each power, a large number of diode or MOS are acceded into the conventional ESD protection device. However, the ESD protection efficiency of power will be degraded. Otherwise, considering the character of diode in use and calculating the number of diode in use accurately are required if using the conventional ESD protection device in circuit. Therefore, the difficulty and complication of circuit design will increase.

It is the principal object of this invention to provide an ESD protection circuit for efficient quarantine between each power to solve the problem, which is the circuit efficiency affected by the dependent operation of power due to the mutual influence between each power when the conventional ESD protection circuit is used.

In accordance with the aforementioned objects of this invention, the invention provides an ESD protection circuit to distinguish between the voltage of ESD and the normal operation voltage of power and let the power is out of the outside influence and operates independently. The ESD protection circuit of this invention is consisted of: an ESD protection cell further comprising: a transistor; a control circuit connected with the gate of the transistor electrically; a voltage selector and one point of the voltage selector connected with the control circuit electrically to output a voltage signal to the control circuit. And an ESD bus connected with the transistor and the voltage selector of the ESD protection cell electrically. The voltage selector of the ESD protection cell connects the power and the ESD bus. One of the drain and the source of the transistor of the ESD protection cell is connected with the power and another one is connected with the ESD bus.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
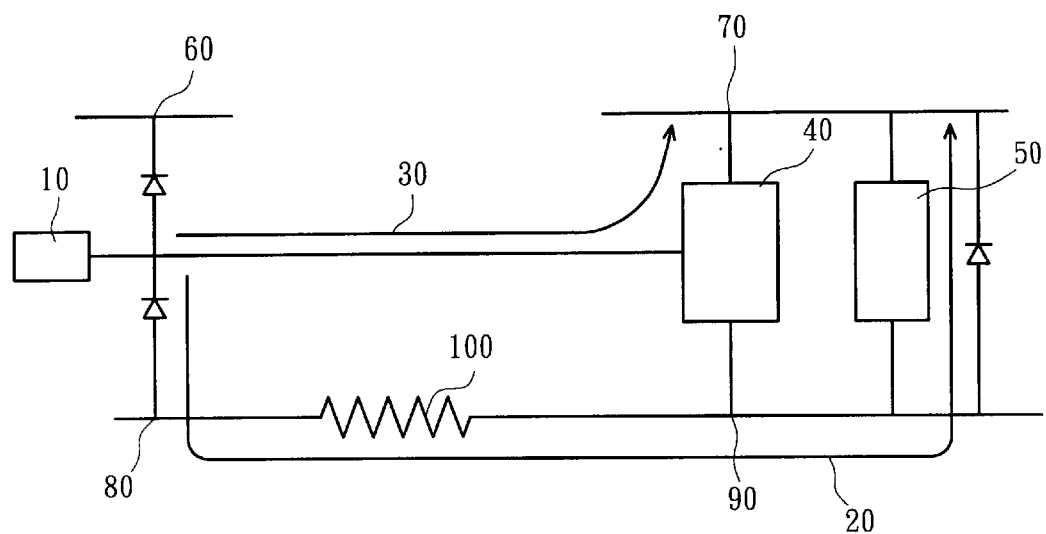
FIG. 1 is an equivalent circuit diagram of a conventional ESD protection circuit of separate power.
Figure 2:
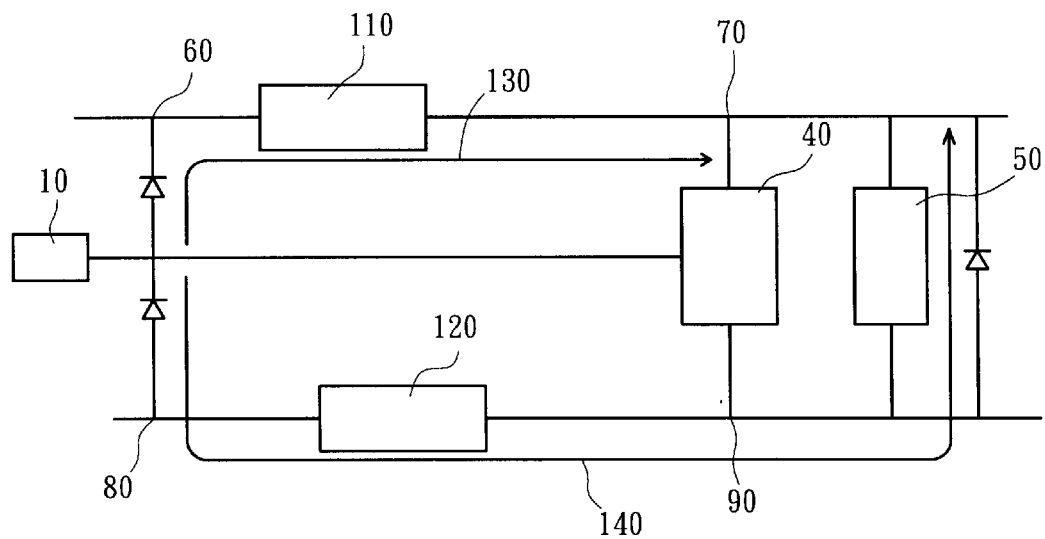
FIG. 2 is an equivalent circuit diagram of a conventional ESD protection circuit of separate power.
Figure 3:
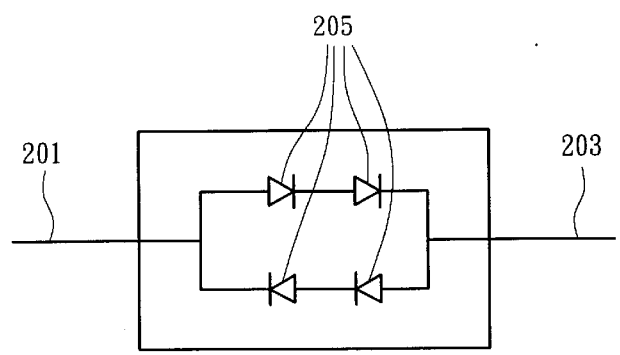
FIG. 3 is an internal circuit diagram of a conventional ESD protection cell.
Figure 4:
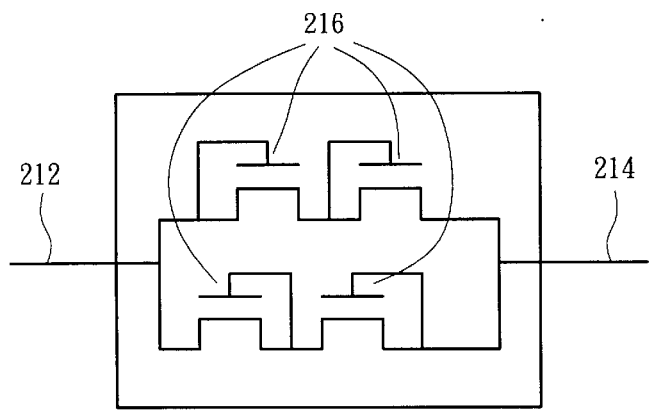
FIG. 4 is an internal circuit diagram of another conventional ESD protection cell.
Figure 5:
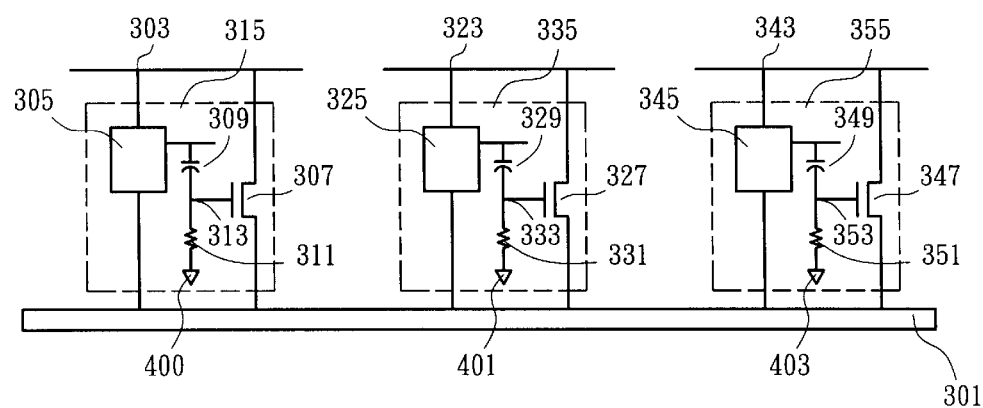
FIG. 5 is a circuit diagram of a preferred embodiment of the present invention, an ESD protection circuit.

Please refer to FIG. 5, which shows that a circuit diagram of a preferred embodiment of the present invention, an ESD protection circuit. Whole chip is surrounded by the ESD bus 301, which serves as the common connection among each ESD protection cell of each separate power supply. Moreover, the ESD bus 301 is not applied any external voltage. The first voltage selector 305 of the first ESD protection cell 315 will compare the voltage of the first power 303 and the voltage of the ESD bus 301 then outputs the higher voltage as the output of the first voltage selector 305. In other words, if the voltage of the first power 303 is higher than the voltage of the ESD bus 301, the voltage of the first power 303 will be the output of the first voltage selector 305. Similarly, the operational principle of the second voltage selector 325 of the second ESD protection cell 335 and the operational principle of the third voltage selector 345 of the third ESD protection cell 355 are same as the principle of the first voltage selector 305 above.

Figure 6:
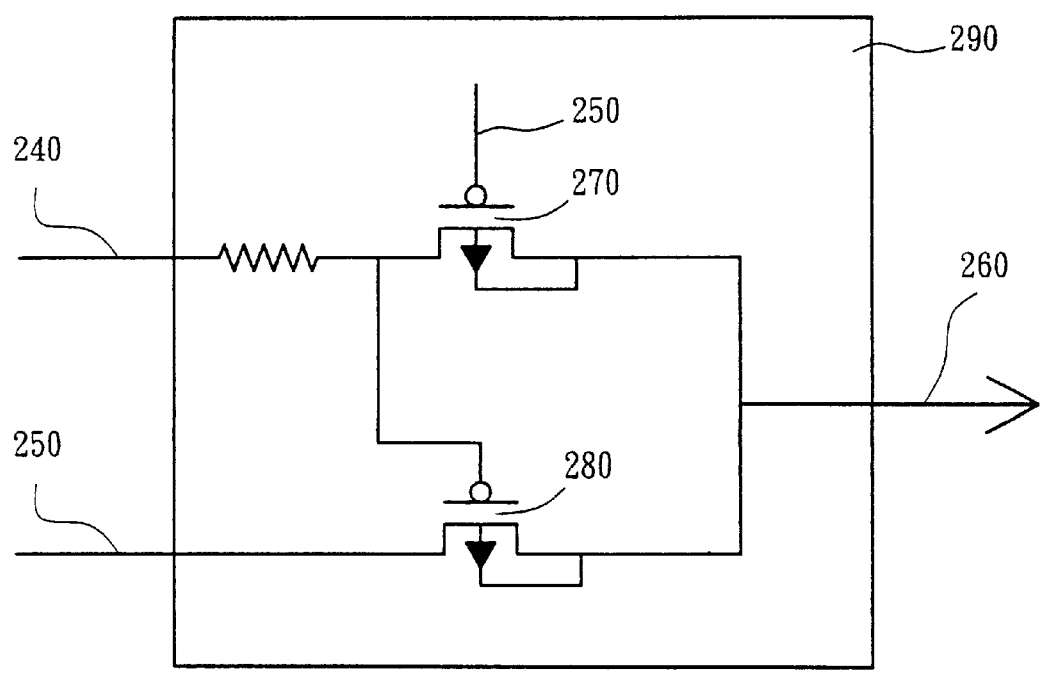
FIG. 6 is a simple circuit diagram of a voltage selector.

Otherwise, referring to FIG. 6, which shows that a simple circuit diagram of a voltage selector. When the first voltage 240 is higher than the second voltage 250, the first transistor 270 is turned on and the second transistor 280 is inactive so that the first voltage 240 is outputted from the voltage selector 290 to the output 260. Similarly, when the second voltage 250 is higher than the first voltage 240, the second transistor 280 is turned on and the first transistor 270 is inactive so that the second voltage 250 is outputted from the voltage selector 290 to the output 260.

Please refer to FIG. 5, the control circuit formed with the first resistance 311 and the first capacitance 309 of the first ESD protection cell 315 is used to distinguish between the normal power-on event and the ESD event. During the ESD event, the rise time of ESD pulse is in ns order, but the rise time of normal power-on is in ms order. In order to distinguish the normal power-on event and the ESD event, the RC time constant of the control circuit can be designed in 1s order (0.1 µs~10 µs).

The first N-type MOS (NMOS) 307 acts as the connection between the first power 303 and the ESD bus 301. Similarly, The second NMOS 327 acts as the connection between the second power 323 and the ESD bus 301. The third NMOS 347 acts as the connection between the third power 343 and the ESD bus 301. During the normal power-on event, NMOS is inactive and during the ESD event, NMOS is turned on to provide a path for discharging ESD current.

According to actuality, the operation steps of a preferred embodiment of the present invention, an ESD protection circuit can distinguish the normal power-on event and the ESD event.

During the normal power-on event, the potential at the first node 313, the second node 333 and the third node 353 are zero regardless of the output of voltage selector because the rise time during power-on (ms order) is much larger than the time constant of RC circuit. Thus, the first NMOS 307, the second NMOS 327 and the third NMOS 347 are inactive during normal operation, resulting the first NMOS 307, the second NMOS 327 and the third NMOS 347 isolated from the ESD bus 301, also from each other.

During the ESD event, there are two embodiments from the ESD event and the description as follows.

In the first embodiment, the first power 303 as power supply is stressed with respect to the second power 323. The bus of the first power 303 will be charged by the ESD current. Due to the fast rise time of ESD pulse (ns order), the ESD current cannot be discharged from the first node 313 to ground during that fast event such that there is a high voltage at the first node 313, resulting a high voltage at the gate of the first NMOS 307. The first NMOS 307 will be turned on and the ESD bus 301 will be charged. At that time, the voltage of the ESD bus 301 is higher than the voltage of the second power 323 so that the second voltage selector 325 outputs a higher voltage to the second node 333, resulting in a high voltage at the gate of the second NMOS 327 and then the second NMOS 327 will be turned on to let the ESD current discharges to the second ground terminal 401 through the second NMOS 327. Therefore, the function of the ESD protection circuit is achieved. The same operational principle above can be also applied when the first power 303 as power supply is stressed with respect to the third power 343. The third NMOS 347 will be turned on to let the ESD current discharges to the third ground terminal 403 through the third NMOS 347 so that the function of the ESD protection circuit is achieved.

In the second embodiment, the second power 323 as power supply is stressed with respect to the first power 303. The bus of the second power 323 will be charged by the ESD current. Due to the fast rise time of ESD pulse (ns order), the ESD current cannot be discharged from the second node 333 to ground during that fast event such that there is a high voltage at the second node 333, resulting in a high voltage at the gate of the second NMOS 327. Therefore, the second NMOS 327 will be turned on and the ESD bus 301 will be charged. At that time, the voltage of the ESD bus 301 is higher than the voltage of the first power 303 so that the second voltage selector 325 outputs a higher voltage to the second node 333, resulting in a high voltage at the gate of the first NMOS 307 and then the first NMOS 307 will be turned on to let the ESD current discharges to the first ground terminal 400 through the first NMOS 307. Therefore, the function of the ESD protection circuit is achieved. The same operational principle above can be also applied when the third power 343 as power supply is stressed with respect to the first power 303. The first NMOS 307 will be turned on to let the ESD current discharges to the first ground terminal 400 through the first NMOS 307 SO that the function of the ESD protection circuit is achieved. Similarly, There is the same operational principle above between the first power 303 and the third power 343, the second power 323 and the third power 343.

According the operation principle above of using this invention, the ESD protection circuit that this invention provides is not limited in the number of using power so can be used popularly.

The advantage of this invention is the application of the ESD protection circuit, which is provided by this invention, in multi-power and mixed-voltage circuit. There is the ESD protection cell for each power and every power is connected with the ESD bus by a group consisting of a transistor, a control circuit and a voltage selector and then connected with other power through the ESD bus. Therefore, each power is isolated from each other by the ESD bus and each ESD protection cell. Either in ESD events or in the independent operation of each power, there would be efficient quarantine between each power, so that the independent operation of multi-power is achieved.

Another advantage of this invention is the application of the ESD protection circuit, which is provided by this invention, in multi-power and mixed-voltage circuit. In the design of circuit, staff only consider the character of NMOS in order to achieve the needful level of circuit.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An ESD protection circuit, which is used to distinguish between a voltage of ESD and a normal operation voltage of a power so that the power can be operated independently and out of the outside influence, comprising of:
    an ESD protection cell, further comprising:
        a transistor;
        a control circuit, connected with a gate of the transistor; and
        a voltage selector, and one point of the voltage selector connected with the control circuit for outputting a voltage signal to the control circuit;
        an ESD bus, connected with the transistor and the voltage selector of the ESD protection cell; and
    the voltage selector of the ESD protection cell connected to the power and to the ESD bus and one of drain and source of the transistor of the ESD protection cell connected with the power and another connected with the ESD bus.

2. The ESD protection circuit of claim 1, wherein the control circuit of the ESD protection cell is formed with a resistance—capacitance circuit and a ground terminal.

3. The ESD protection circuit of claim 1, wherein the transistor of the ESD protection cell is a NMOS transistor.

4. An ESD protection circuit, which is used to distinguish between a voltage of ESD and a normal operation voltage of a plurality of powers so that the plurality of powers can be operated independently and out of the outside influence, comprising of:
    a plurality of ESD protection cells, further comprising:
        a plurality of transistors;
        a plurality of control circuits, connected with a gate of one of the transistors; and
        a plurality of voltage selectors, and one point of the plurality of voltage selectors connected with the plurality of control circuits for outputting a voltage signal to the plurality of control circuits;
    an ESD bus, connected with the plurality of transistors and the plurality of voltage selectors of the plurality of ESD protection cells; and
    the plurality of voltage selectors of the plurality of ESD protection cells connected to the plurality of powers and to the ESD bus and one of a plurality of drains and sources of the plurality of transistors of the plurality of ESD protection cells connected with the plurality of powers and another one of a plurality of drains and sources of the plurality of transistors of the plurality of ESD protection cells connected with the ESD bus.

5. The ESD protection circuit of claim 4, wherein the plurality of control circuits of the plurality of ESD protection cells is formed with resistance—capacitance circuit and ground terminal.

6. The ESD protection circuit of claim 4, wherein the plurality of transistors of the plurality of ESD protection cells is a plurality of NMOS transistors.

* * * * *